(12) United States Patent
Hinkle et al.

(10) Patent No.: US 6,902,952 B2
(45) Date of Patent: *Jun. 7, 2005

(54) MULTI-PART LEAD FRAME WITH DISSIMILAR MATERIALS AND METHOD OF MANUFACTURING

(75) Inventors: S. Derek Hinkle, Boise, ID (US); Jerry M. Brooks, Caldwell, ID (US); David J. Corisis, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 112 days.

This patent is subject to a terminal disclaimer.

(21) Appl. No.: 10/076,849

(22) Filed: Feb. 14, 2002

(65) Prior Publication Data

US 2002/0076857 A1 Jun. 20, 2002

Related U.S. Application Data

(60) Continuation of application No. 09/699,538, filed on Oct. 30, 2000, now Pat. No. 6,362,022, which is a continuation of application No. 09/339,284, filed on Jun. 23, 1999, now Pat. No. 6,140,154, which is a division of application No. 08/738,308, filed on Oct. 25, 1996, now Pat. No. 6,072,228.

(51) Int. Cl.[7] .............................................. H01L 21/50
(52) U.S. Cl. ....................................... 438/107; 438/123
(58) Field of Search ................................ 438/123, 106, 438/112, 111, 107, 109, 108

(56) References Cited

U.S. PATENT DOCUMENTS

| | | | |
|---|---|---|---|
| 4,984,059 A | | 1/1991 | Kubota et al. |
| 5,014,113 A | | 5/1991 | Casto |
| 5,184,208 A | | 2/1993 | Sakuta et al. |
| 5,198,883 A | | 3/1993 | Takahashi et al. |
| 5,227,662 A | | 7/1993 | Ohno et al. |
| 5,252,853 A | | 10/1993 | Michii |
| 5,286,679 A | | 2/1994 | Farnworth et al. |
| 5,304,842 A | | 4/1994 | Farnworth et al. |
| 5,336,639 A | | 8/1994 | Nagaraj et al. |
| 5,339,518 A | | 8/1994 | Tran et al. |
| 5,367,766 A | * | 11/1994 | Burns et al. .................. 29/848 |
| 5,394,607 A | | 3/1995 | Chiu et al. |
| 5,461,255 A | | 10/1995 | Chan et al. |
| 5,484,959 A | * | 1/1996 | Burns ........................ 174/52.4 |
| 5,770,480 A | * | 6/1998 | Ma et al. .................... 438/123 |
| 5,796,162 A | | 8/1998 | Huang |
| 5,907,769 A | | 5/1999 | Corisis |
| 6,140,154 A | * | 10/2000 | Hinkle et al. ............... 438/123 |
| 6,362,022 B1 | * | 3/2002 | Hinkle et al. ............... 438/123 |

FOREIGN PATENT DOCUMENTS

JP      54-21168      2/1979

* cited by examiner

*Primary Examiner*—Wael Fahmy
*Assistant Examiner*—(Vikki) Hoa B. Trinh
(74) *Attorney, Agent, or Firm*—TraskBritt

(57) ABSTRACT

A multi-part lead frame die assembly is disclosed including a die bonded to a die paddle. A second lead frame including leads is superimposed and bonded onto the first lead frame. Also disclosed is a method for fabricating the multi-part lead frame assembly which utilizes equipment designed for single lead frame processing. If desired, the materials for the multi-part lead frame may be dissimilar.

13 Claims, 11 Drawing Sheets

MULTI-PART LEAD FRAME WITH DISSIMILAR MATERIALS AND METHOD OF MANUFACTURING

CROSS-REFERENCE TO RELATED APPLICATIONS

This application is a continuation of application Ser. No. 09/699,538, filed Oct. 30, 2000, now U.S. Pat. No. 6,362, 022, which is a continuation of application Ser. No. 09/339, 284, filed Jun. 23, 1999, now U.S. Pat. No. 6,140,154, issued Oct. 31, 2000, which is a divisional of application Ser. No. 08/738,308, filed Oct. 25, 1996, now U.S. Pat. No. 6,072, 228, issued Jun. 6, 2000.

BACKGROUND OF THE INVENTION

1. Field of the Invention

The present invention relates to a molded semiconductor device and a method for fabricating the same. More particularly, the present invention relates to a semiconductor die assembly utilizing a multi-part lead frame having dissimilar materials and the method for fabricating the same. The multi-part lead frame can be used for a wide variety of types of lead frames, such as modified conventional lead frames, leads-over-chip (LOC) lead frames, hybrid lead frames, etc.

2. State of the Art

Conventional well known molded semiconductor devices are constructed by assembling and interconnecting a semiconductor device to a lead frame and molding the structure in plastic. In a "conventional" or "traditional" type of lead frame construction, a lead frame is made from a metal ribbon, with each lead frame including a paddle (also known as a die paddle, die-attach tab, or island) for attaching a semiconductor device thereto and a plurality of leads arranged such that the leads do not overlap the paddle on which the semiconductor device is to be mounted.

In order to overcome inherent limitations created by the size and bond pad arrangement of semiconductor device assemblies using conventional types of lead frames, leads-over-chip (LOC) semiconductor device assemblies have been employed. The LOC lead frame configuration for a semiconductor device replaces the conventional lead frame configuration with a lead frame configuration having no die paddle and having lead fingers or leads that extend over the active surface of the semiconductor device. The semiconductor device is supported by being adhesively secured to the lead fingers by means of a dielectric film disposed between the undersides of a portion of the lead fingers and the semiconductor device. Examples of assemblies implementing LOC lead frame technology are disclosed in U.S. Pat. Nos. 5,184,208; 5,252,853; 5,286,679; 5,304,842; and 5,461,255. In some instances, LOC lead frame assemblies employ additional quantities of adhesive to enhance physical support of the semiconductor device for handling.

Traditional lead frame semiconductor device assemblies have a semiconductor device attached to a die paddle of the lead frame. The die paddle having a semiconductor device attached thereto is located adjacent the inner ends of the lead fingers of the lead frame so that the inner ends of the lead fingers are in close lateral proximity to the bond pads located at the periphery of the active surface of the semiconductor device. Wire bonds are formed between the inner ends of the lead fingers and the bond pads on the periphery of the semiconductor device.

In contrast, LOC lead frame assemblies have lead fingers of the lead frame extending over the active surface of the semiconductor device and adhesively attached thereto. This permits physical support of the semiconductor device from the lead fingers themselves, permits more diverse placement of the bond pads on the active surface of the semiconductor device, and permits the use of the lead fingers for heat transfer from the semiconductor device. However, use of LOC lead frame assemblies in combination with plastic packaging of the LOC lead frame assembly has demonstrated some shortcomings of LOC technology and economics.

After wire bonding the semiconductor device to the lead fingers of the lead frame forming an assembly, the most common manner of forming a plastic package about a semiconductor device assembly is transfer molding. In the transfer molding of an LOC type lead frame and semiconductor device assembly, a semiconductor device, which is adhesively suspended by its active surface from the lead fingers of an LOC lead frame and has the bond pads of the semiconductor device and the inner ends of lead fingers of the lead frame connected by wire bonds, is placed in a mold cavity and molded in a thermosetting polymer to form a highly cross-linked matrix.

One of the technological shortcomings of the prior art LOC semiconductor device assemblies is that the adhesive tape used to bond to the lead fingers of the lead frame does not adequately lock the lead fingers in position. In some instances, the adhesive on the tape is not strong enough to lock the lead fingers in position for wire bonding, as the lead fingers may pull away from the tape before wire bonding. Alternately, the lead fingers may pull away from the tape after wire bonding of the semiconductor device but before molding of the semiconductor device and LOC lead frame, thereby either causing shorts between adjacent wire bonds or the wire bonds to pull loose from either the bond pads of the semiconductor device or the lead fingers of the lead frame. With respect to economic considerations, a cost reduction can be realized by replacing the more expensive adhesives and tapes used in the LOC lead frame and semiconductor device assembly with a lower cost lead frame having characteristics of both a conventional type lead frame configuration and an LOC type lead frame configuration.

An alternative type lead frame to an LOC lead frame and semiconductor device assembly is disclosed in U.S. Pat. No. 4,984,059 to Kubota et al. In this alternative type lead frame and semiconductor device assembly, two metal lead frames are used. A die paddle, onto which a semiconductor device is subsequently attached, is formed between the longitudinal sides of a first lead frame. A second lead frame is formed having lead fingers extending between the longitudinal sides thereof. An assembly is formed by welding the first lead frame having a semiconductor device attached to the die paddle to the second lead frame having the lead fingers thereof extending over the active surface of the semiconductor device. The welding is accomplished by welding cradles running along the two longitudinal sides of each lead frame. Alignment of the two lead frames is accomplished by matching alignment holes found on the cradles with alignment holes in the longitudinal sides of each lead frame. The double lead frame assembly thus eliminates the need for tapes or adhesives as a means to support the die from the lead fingers themselves, as the semiconductor device is supported by the die paddle of the first lead frame. In an alternative arrangement, the '059 patent discloses a semiconductor device that is attached to a die paddle having arms extending therefrom with the arms of the die paddle being attached to receiving portions of a lead frame having a plurality of leads formed therewith. However, use of either double lead frame assemblies or separately formed die paddles subsequently attached to receiving portions of a lead frame in combination with a molded packaging lead frame assembly so formed has demonstrated shortcomings in terms of technology and economics.

One such shortcoming involves the manufacturing area. In the molding process, the double lead frame process requires molds specifically adapted for receiving two lead frames. Thus, in order to practice the double lead frame process, existing "single lead frame" equipment must be replaced.

Another shortcoming affects the design and reliability of the packaged semiconductor device. The double lead frame assemblies disclosed in the prior art are limited to use of metal ribbons of the same material to form both lead frame structures.

A shortcoming of the separately formed die paddle subsequently attached to receiving portions of a lead frame is that the separately formed die paddle is difficult to handle and to accurately attach to the lead frame, thereby creating wire bonding problems between the leads of the lead frame and the bond pads of the semiconductor device.

However, designing double lead frame assemblies that utilize different metallic and/or non-metallic materials to fabricate the two lead frames allows packaging and operational advantages. Materials can be selected which closely match either the mold compound properties, the semiconductor device properties, or both, in order to capitalize on a desired effect or characteristic (e.g. fabricating a die paddle with A-42 type alloy material to deal with thermal expansion and fabricating the lead frame with copper material to increase speed of transmission). Additionally, packaging advantages can be realized by using materials of different thicknesses to obtain desired effects such as conservation of space to form smaller packages or increased heat dissipation from the package. Furthermore, desirable characteristics of different types of lead frames may be combined into double lead frame assemblies, particularly where the semiconductor device is accurately located with respect to the lead frame.

From the foregoing, the prior art has neither provided a multilayer molded semiconductor device package that is fabricated through conventional single lead frame assembly and molding processes, nor has it provided for use of dissimilar lead frame materials to fabricate a multilayer molded plastic semiconductor device package.

BRIEF SUMMARY OF THE INVENTION

The present invention provides a multi-part lead frame and semiconductor device assembly which includes a die paddle, the multi-part lead frame being separately formed and assembled from dissimilar or separate materials, if desired. The use of separate or different materials for the lead fingers of the lead frame and die paddle provides packaging and operational advantages through the availability of a variety of materials which can be selected to closely match the mold compound and semiconductor device properties. Another advantage of the present invention is to provide a semiconductor device assembly fabricated from less expensive materials than those currently being used.

These and other advantages of the present invention are accomplished by a semiconductor device or die assembly that includes a semiconductor device having an active surface having, in turn, a plurality of bond pads formed thereon and a lead frame assembly including a first lead frame and a second lead frame. The first lead frame includes a die paddle onto which the semiconductor device is attached, first carriers and tie bars connecting the die paddle to the carriers of the lead frame. The first carriers are usually vertically spaced from the die paddle such that the die paddle is located in a horizontal plane below the first carriers so that when the semiconductor device or die is mounted on the die paddle, the active surface of the semiconductor die is located in substantially the same horizontal plane as the first carriers. The second lead frame of the lead frame assembly includes a plurality of lead fingers extending inwardly from second carriers having second alignment holes therein, each lead finger of the plurality of lead fingers including an inner lead portion and an outer lead portion secured to a carrier. The inner lead portion of each lead finger is located in a predetermined location with respect to the bonds pads on the active surface of a semiconductor device attached to the die paddle of the first lead frame after portions of the first and second lead frames have been joined. The inner lead portion of each lead finger is also horizontally spaced at a predetermined location from the bond pads located on the active surface of the semiconductor device attached to the die paddle of the first lead frame after portions of the first and second lead frames have been joined. Wire bonds interconnect the inner lead portion of each lead finger and the bond pads of the semiconductor device or die. The second lead frame further includes tab receiving portions for securing or attaching portions of tie bars of the first lead frame to the second lead frame.

The present invention further includes a method of fabricating a semiconductor device. In accordance with the method of the present invention, a semiconductor device having an active surface having, in turn, bond pads formed thereon is used. Also used in the method of the present invention is a first lead frame including a die paddle, first carriers having alignment holes therein, and tie bars having cut zones and tabs therein. The tie bar interconnects the die paddle and first carriers. The semiconductor device is attached to the die paddle. Next, a second lead frame having second carriers and a plurality of lead fingers is used in the method of the present invention. The second carriers of the second lead frame include tab receiving portions affixed thereto and second alignment members. The first and second lead frames are aligned by aligning the plurality of first alignment members and second alignment members together. The first and second lead frames are then joined by securing the tabs of the first lead frame to the tab receiving portions of the second lead frame. The tie bars are then cut at a point between the tabs and the first carriers and the first carriers are discarded. Finally, the inner lead ends of the lead fingers and the bond pads of the semiconductor device are interconnected with wire bonds.

The semiconductor device assembly of the present invention permits the use of "single lead frame" equipment through all existing manufacturing steps instead of replacing existing equipment for a so called "double lead frame" process.

The semiconductor device assembly may be molded into the desired package using conventional apparatus and methods.

Securing of the first and second lead frames (or portions thereof) may be accomplished by welding, adhesive bonding, or any other suitable method of bonding.

The lead frame configuration of the present invention may be a conventional type, an LOC type, a hybrid type, etc.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIG. 1b is a sectional view along lines IB—IB in FIG. 1a;

DETAILED DESCRIPTION OF THE INVENTION

Figure 1A:
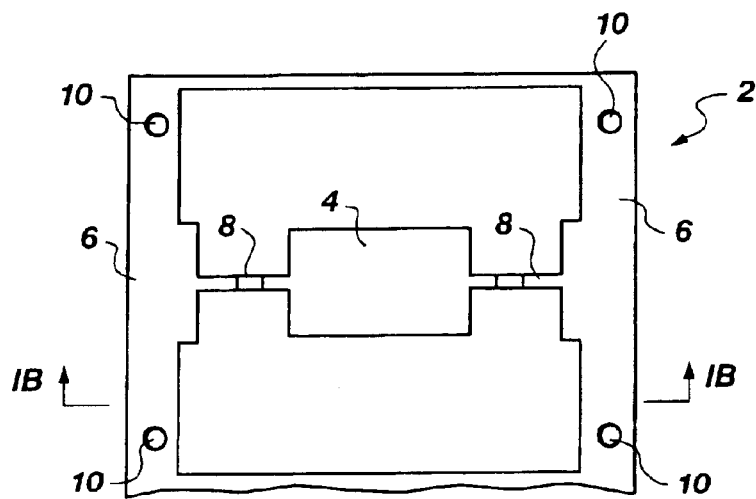
FIG. 1a is a plan view of a prior art assembly of a semiconductor device before molding.
Figure 1B:
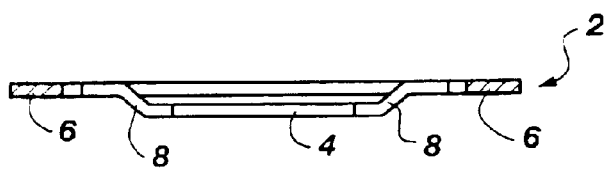
Figure 1C:
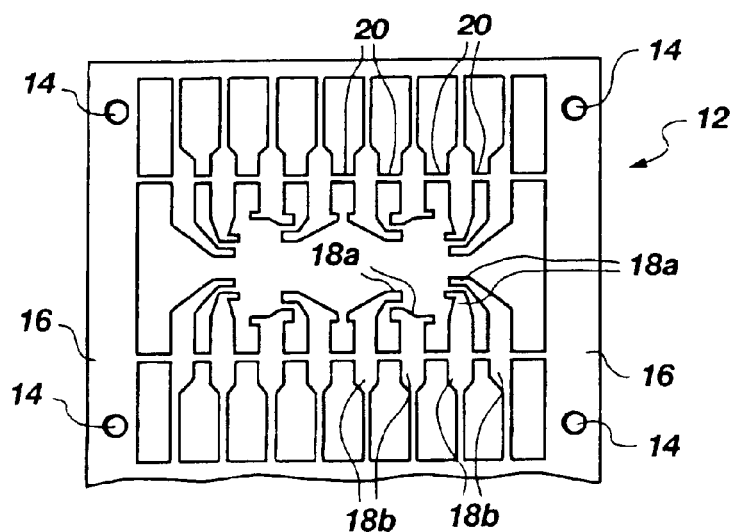
FIG. 1c is a plan view of a prior art assembly semiconductor device before molding.

For a better understanding of the present invention, the prior art is described with reference to drawing FIGS. 1a, 1b, 1c and 2. FIGS. 1a, 1b, and 1c illustrate a prior art device in which two metal lead frames are used for fabricating a semiconductor device. FIGS. 1a and 1b (taken along line IB—IB of FIG. 1a) illustrate a die paddle 4 that is formed as part of a first lead frame 2 and that is tied to carriers 6 with tie bars 8. The first lead frame 2 comprises carriers 6 running along two longitudinal sides of the first lead frame itself and is provided with alignment holes 10. The carriers 6 are bent to differentiate the levels of the die paddle 4 in relation to the ends of the carriers 6.

FIG. 1c illustrates a second lead frame 12 comprising carriers 16 running along two longitudinal sides of the second lead frame itself. The second lead frame 12 is provided with alignment holes 14, a plurality of leads 18 consisting of an inner lead portion 18a and an outer lead portion 18b, and dam bars 20 tying the leads 18 to each other and to the carriers 16.

Figure 2:
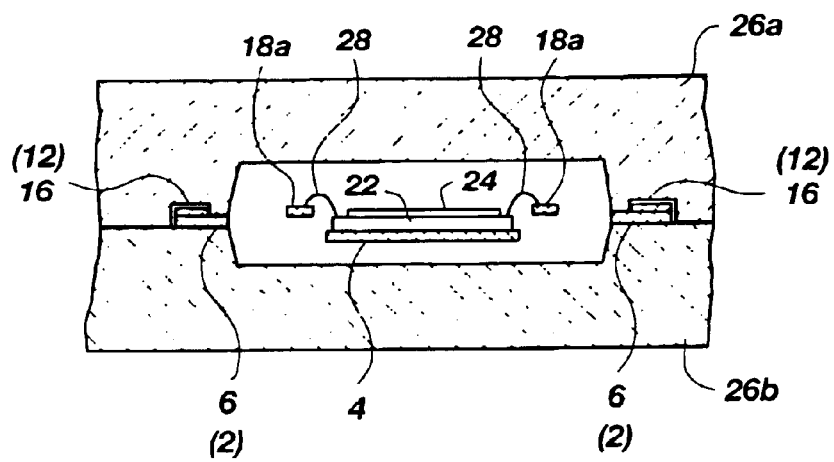
FIG. 2 is a cross-sectional view of a mold used in encapsulating a prior art assembly.

In the fabrication of a semiconductor device, referring to drawing FIGS. 1a, 1b, 1c, and 2 (which illustrates a mold used in the double lead frame assembly process), a semiconductor die 22 is bonded onto the die paddle 4. An insulating film 24 may be bonded onto the top surface of the die paddle 4 to insulate the semiconductor die 22. The inner lead portions 18a of second lead frame 12 are connected to an active surface of semiconductor die 22 by means of wire bonding 28. First lead frame 2 is then fixed to second lead frame 12 by welding a portion of the carrier 6 of first lead frame 2 to a portion of the carrier 16 of second lead frame 12. This particular assembly requires a particular mold adopted for receiving two lead frames, as illustrated in FIG. 2. As can be seen from FIG. 2, a mold 26 comprising an upper half 26a and a lower half 26b holds carriers 6 and 16 of lead frames 2 and 12, respectively.

An alternative embodiment of the prior art device shown in drawing FIGS. 1a, 1b, 1c, and 2 comprises the same assembly steps described before, except that die paddle 4 is not formed as part of a first lead frame 2. Instead, die paddle 4 and tie bars 8 are welded directly onto a tie-receiving portion formed on the second lead frame 12. Due to the exclusion of the carrier 6 and alignment holes 10 of first lead frame 2, this alternative embodiment requires specialized equipment to locate, align and weld the tie bars 8 to the tie-receiving portion of the alternative second lead frame 12.

Figure 3:
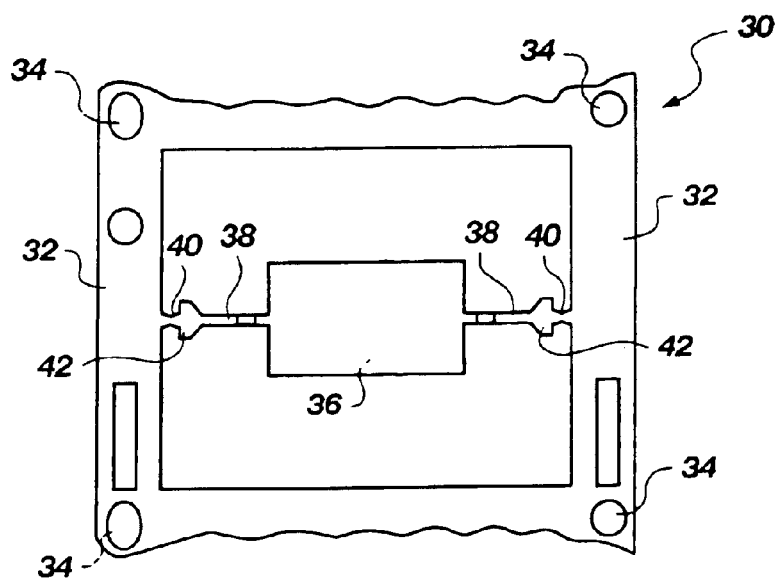
FIG. 3 is a plan view of a first lead frame and die paddle.
Figure 4:
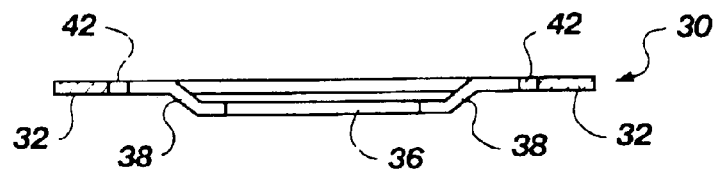
FIG. 4 is a sectional view of the first lead frame and die paddle of FIG. 3.

In contrast to the prior art, FIGS. 3 and 4 illustrate a first embodiment of a first lead frame 30 according to the present invention. The first lead frame 30 is made from any metallic material, non-metallic material, or any combinations thereof, which exhibit desirable properties with respect to, for example, thermal conductivity, coefficient of thermal expansion, heat dissipation, strength, and formability. Well known examples of such materials (used alone or in combination) include alloy 42, copper, aluminum, silver, ceramic compounds, organic and inorganic silicone based compounds, plastic compounds, and glass-epoxy based organic materials, reinforced organic materials, etc.

Referring to FIG. 3, the first lead frame 30 comprises first carriers 32 running along the two longitudinal sides of the first lead frame and further is provided with alignment holes 34 thereon. A die paddle 36 is connected to first carriers 32 by means of tie bars 38. The die paddle 36 has sufficient length and width to easily accommodate semiconductor chips or dice of varying sizes and shapes. Tie bar cut zones 40 and attachment tabs 42 are provided on tie bars 38 for use in assembling the semiconductor device, as more fully set forth below (see FIGS. 7a to 7f). Attachment tabs 42 consist of co-planar extensions emanating from the tie bars, each attachment tab 42 being substantially larger and/or wider than the tie bar 38 to which the attachment tab 42 is connected, although the attachment tab 42 may be any desired size and/or configuration suitable for use. Tie bar cut zones 40 consist of preweakened, cutaway or recessed portions located between the attachment tabs 42 and the first carriers 32 on the tie bars 38. As can be seen from FIG. 4, the tie bars 38 are bent downwardly, so as to position the die paddle 36 in a substantially horizontal arrangement with and at a lower level in relation to the first carriers 32 and first lead frame 30. Because the degree of pitch in the bend, as well as the length and width of the tie bars 38, is dependent on the height of the semiconductor chip or die to be placed on the die paddle 36, the tie bars 38 will correspondingly vary with regard to shape and angle of bend in order to accommodate a wide variety of semiconductor device shapes and sizes. Inclusion of first carriers 32 and alignment holes 34 permit the use of existing equipment used in single lead frame processes to accomplish the attachment of the semiconductor device 44 (FIG. 5) onto the die paddle 36.

Figure 5:
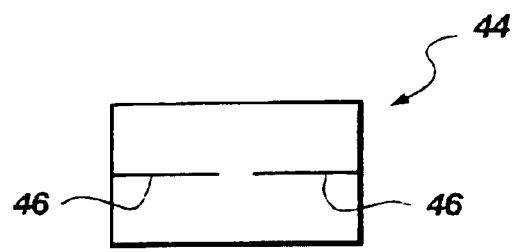
FIG. 5 is a plan view of a semiconductor device.

FIG. 5 illustrates a semiconductor device 44 having bond pads 46 placed in a linear arrangement on an active surface of the semiconductor device 44. It is understood that any semiconductor device having various arrangements of bond pads known in the art can be used. It will also be understood that the semiconductor device 44 is not limited with respect to length, width, thickness, or material composition.

Figure 6:
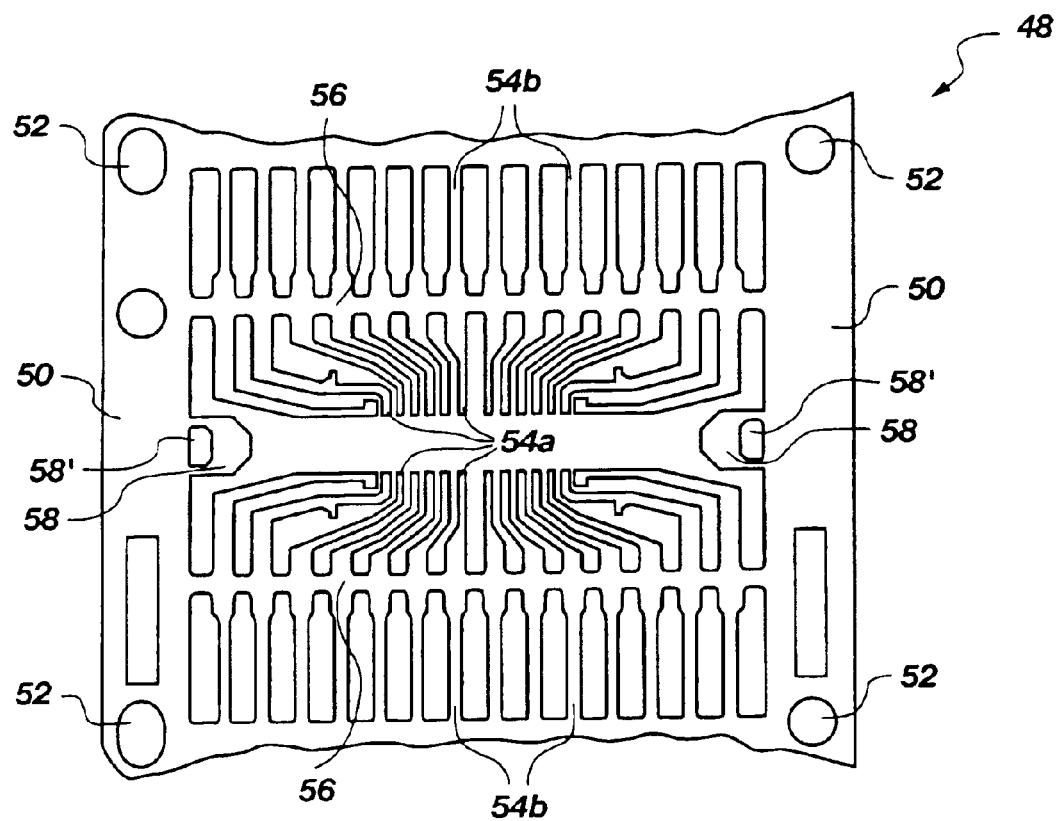
FIG. 6 is a plan view of a second lead frame.

FIG. 6 illustrates a second lead frame 48 according to the present invention. The second lead frame 48 comprises second carriers 50 running along the two longitudinal sides of the second lead frame 48, alignment holes 52, a plurality of leads 54 consisting of an inner lead portion 54*a* and an outer lead portion 54*b*, dam bars 56 tying the leads 54 to each other and to second carriers 50, and attachment tab receiving portions 58 having apertures 58' therein. Each attachment tab receiving portion 58 is formed being of substantially the same size and shape as the attachment tab 42, or at least as large and substantially the same shape with which it is to be attached, although the attachment tab 42 and attachment tab receiving portion 58 to which it is attached may have any suitable desired size and shape depending upon the geometry and size of the semiconductor device, the die paddle, and the lead frame. The second lead frame 48 can be made from any metallic material, non-metallic material, or any combinations thereof which exhibit desirable properties with respect to, for example, electrical conductivity, coefficient of thermal expansion, strength, and formability which are compatible with, although preferably a different or separate material from, the first lead frame 30, but yet compatible therewith and with the semiconductor device 44. Well known examples of such materials (used alone or in combination) include, but are not limited to, alloy 42, copper, aluminum, and silver. Attachment tab receiving portions 58, having apertures 58' therein, preferably consist of co-planar, flat extensions of the second carriers 50.

Alignment holes 34 and 52 can be formed in a variety of shapes and positions with the purpose of accommodating particular types of equipment used both to align and weld the first lead frame 30 to the second lead frame 48, as further described below. Alignment holes 34 and 52 preferably consist of uniformly shaped, extruded sections of first and second carriers 32 and 50.

Figure 7A:
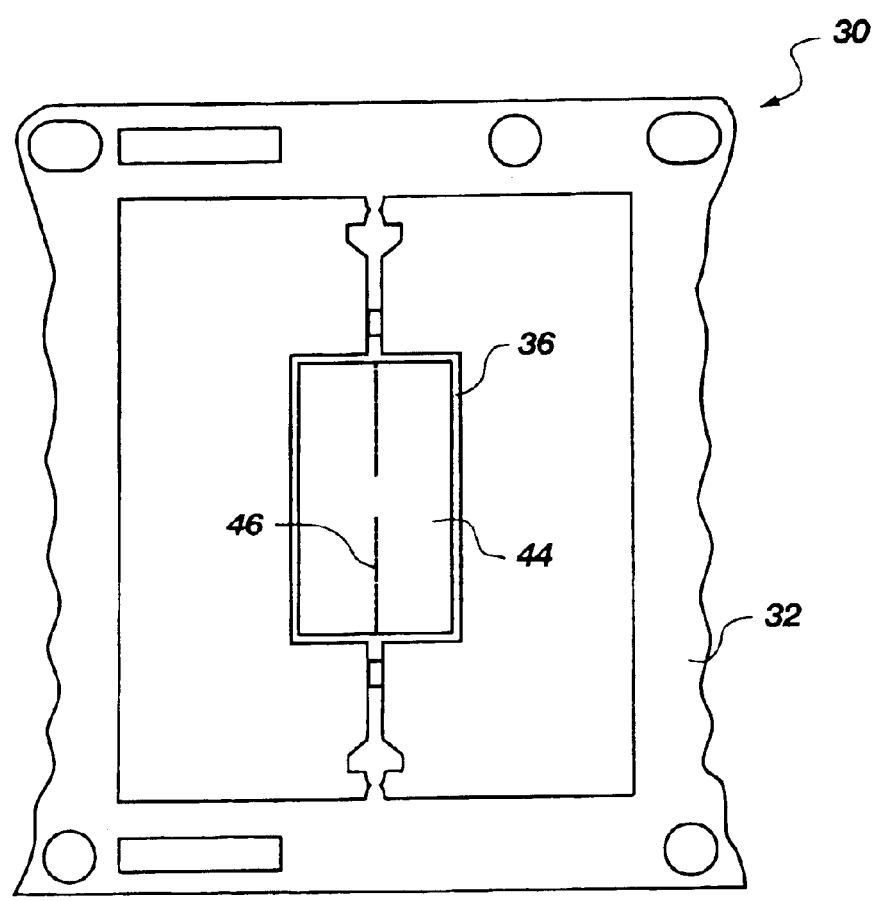
FIGS. 7a to 7f are diagrams for explaining a manufacturing process of a semiconductor device according to a first embodiment of the present invention.
Figure 7B:
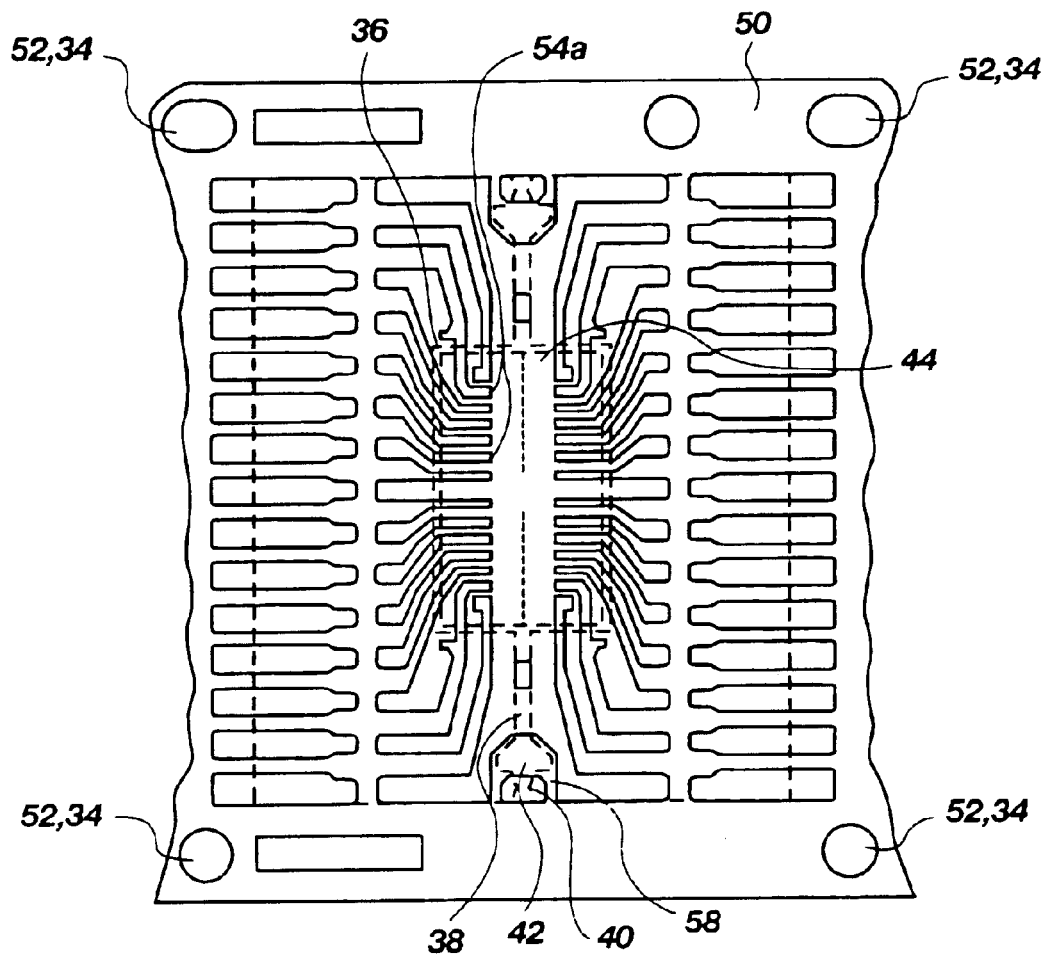
Figure 7C:
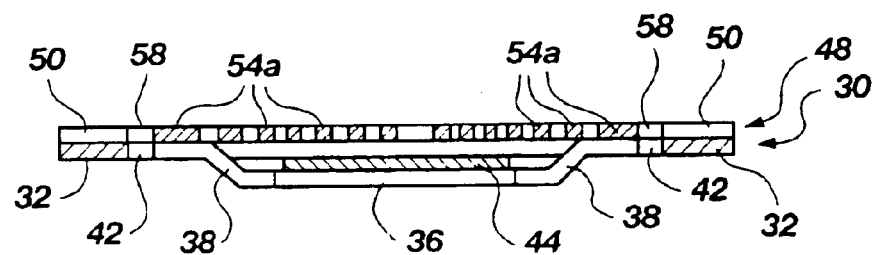

FIGS. 7*a* to 7*f* illustrate a method of fabricating a semiconductor device according to the present invention. Referring to FIG. 7*a*, the semiconductor device 44 is attached or bonded onto the die paddle 36 of the first lead frame 30 using a conventional single lead frame process and equipment. As previously described, the first lead frame will comprise a die paddle 36 of sufficient size and sufficient depth (in relation to the first carriers 32) to accommodate a preselected semiconductor chip of a particular length, height, and width. The semiconductor device 44 can be bonded onto the die paddle 36 with, for example, silver paste, polyamide, or any other means of bonding known in the art. An insulating film (e.g. silicon tape or polyamide) can be applied to the top or active surface of the semiconductor device 44, excluding the electrodes or bond pads 46, to electrically and physically insulate the semiconductor device 44 against damage resulting from direct contact with leads 54 during a subsequently described wire bonding process. Referring to FIGS. 7*b* and 7*c*, once the semiconductor device 44 has been bonded to the die paddle 36, the first and second lead frames are aligned by superimposing a bottom surface of the second lead frame 48 onto a top surface of the first lead frame 30 and by aligning alignment holes 34 of lead frame 30 with the corresponding alignment holes 52 of the second lead frame 48. In the resulting alignment, the inner lead portions 54*a* of the second lead frame 48 overlap the semiconductor device 44. The attachment tabs 42 of the first lead frame 30 are then attached or welded or bonded to the attachment tab receiving portions 58 of the second lead frame 48. It is understood that any suitable adhering or welding processes known in the art, such as spot welding, heat pressure welding, adhesive taping, polyamide bonding, etc. can be used. A cross-sectional view of the assembled and interconnected dual lead frame structure is illustrated in FIG. 7*c*.

Figure 7D:
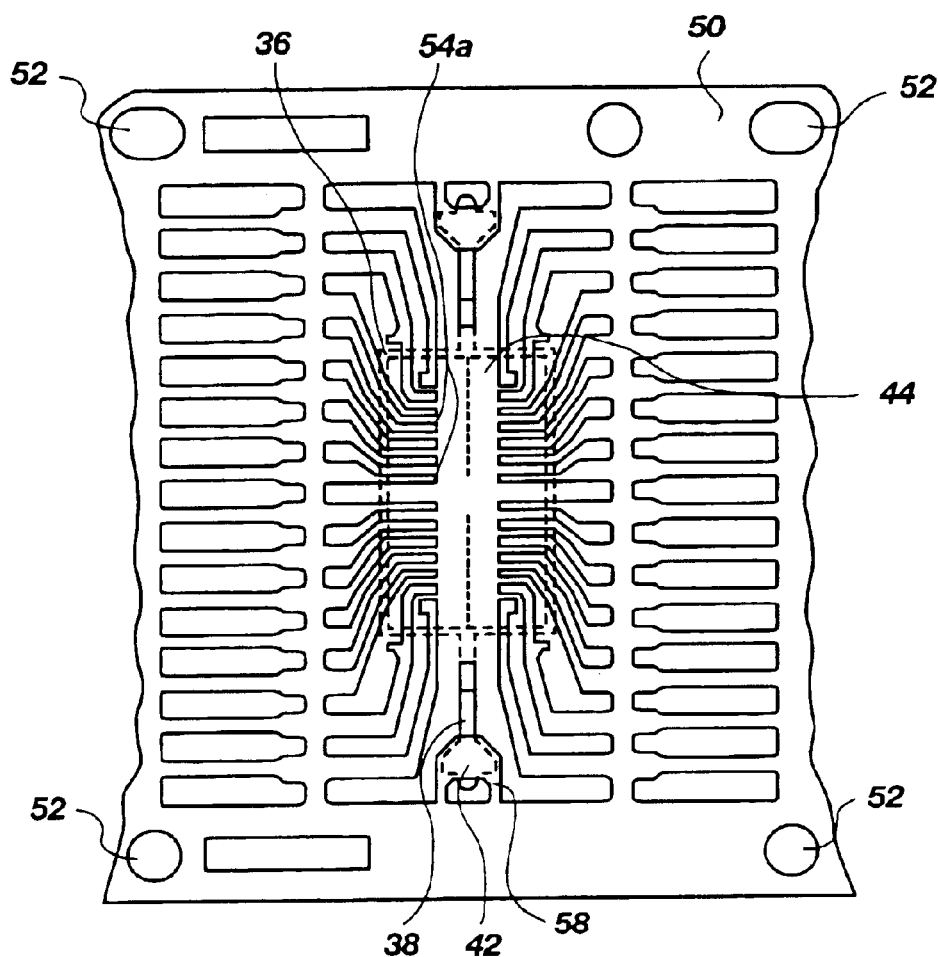
Figure 7E:
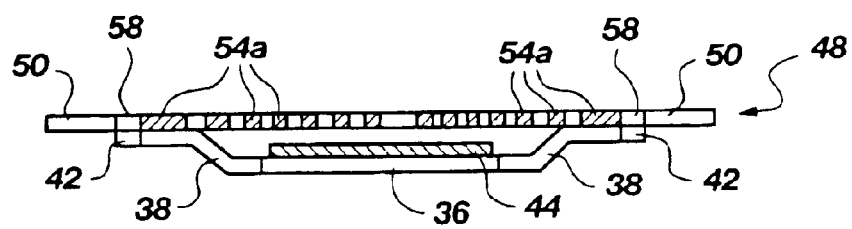

Referring to FIGS. 7*d* and 7*e*, once the alignment and adhering steps are completed, the first carriers 32 of the first lead frame 30 are removed from the die paddle 36, tie bars 38, and attachment tabs 42 by severing or cutting the tie bar cut zones 40 (shown in FIG. 3 and FIG. 7*b*) of the first lead frame 30 using any suitable severing or cutting tool which can extend through apertures 58' of attachment tab receiving portion 58 in the second lead frame 48. The first carriers 32 of the first lead frame 30 are discarded, leaving an intact second lead frame 48 including a die paddle 36 which is connected to the attachment tab receiving portion 58 of the second lead frame 48 by means of the tie bars 38 and attachment tabs 42. Thus, the present step in the method converts the double lead frame assembly of the prior "align and weld" step into a single lead frame assembly in order to facilitate the use of conventional single lead frame equipment in conducting the subsequent wire bonding step of the assembly process. A cross-sectional view of the assembled and interconnected single lead frame structure with attached die paddle 36 is illustrated in FIG. 7*e*.

Figure 7F:
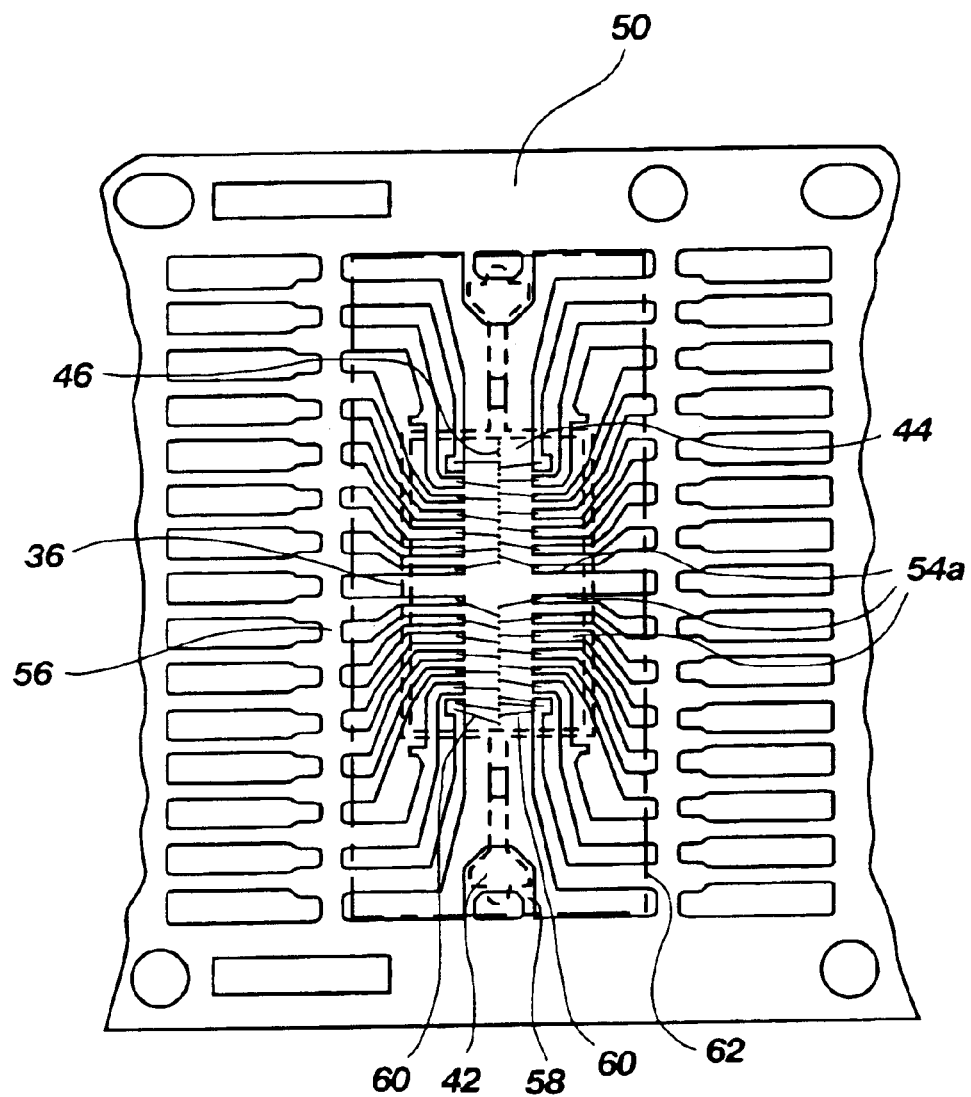

As illustrated in FIG. 7*f*, the bond pads 46 of the semiconductor device 44 and the inner lead portions 54*a* of the leads 54 are then interconnected by any suitable means of wire bonding 60 (e.g. gold wire bonding).

Figure 8:
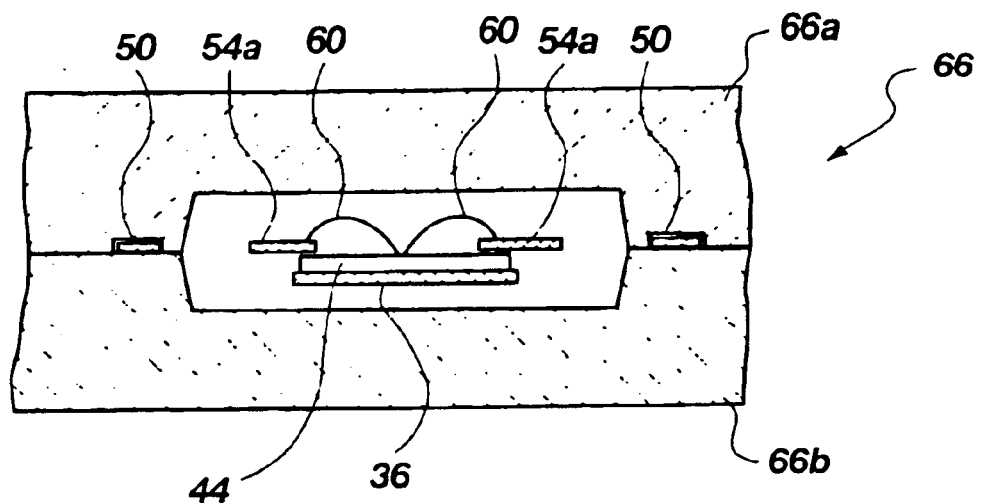
FIG. 8 is a cross-sectional view of a mold including the assembly according to a first embodiment of the present invention.

FIG. 8 illustrates a cross-sectional view of a conventional mold, adapted for receiving a single lead frame, and the single lead frame assembly of FIG. 7*f*. Upon completion of the wire bonding stage, the assembled and interconnected single lead frame structure including the second lead frame 48, the die paddle 36, the semiconductor device 44, and the wire bonds 60 are set in a transfer mold 66, which comprises an upper half 66*a* and a lower half 66*b*. The mold 66 includes a mold space having a portion thereof running along the dam bars 56 (not shown in FIG. 8) and near the second carriers 50 of the second lead frame 48, as illustrated by dashed line 62 in FIG. 7*f*. Thus, the mold space containing the portion of the assembly comprising the die paddle 36, the semiconductor device 44, the inner lead portions 54*a* of the leads 54, and the wire bonds 60, is then filled with a thermosetting polymer such as, for example, an epoxy resin. Upon completion of the molding process, the second carriers 50 and sections of the dam bars 56 located between leads 54 of the second lead frame 48 are removed, so as to separate the molded body and the outer lead portions 54*b* and form a molded semiconductor device assembly. Such removal can be accomplished with a press or other known suitable means. Subsequent steps may include bending of the outer lead portions 54*b*, metal plating, and any other desired conventional steps.

Figure 9:
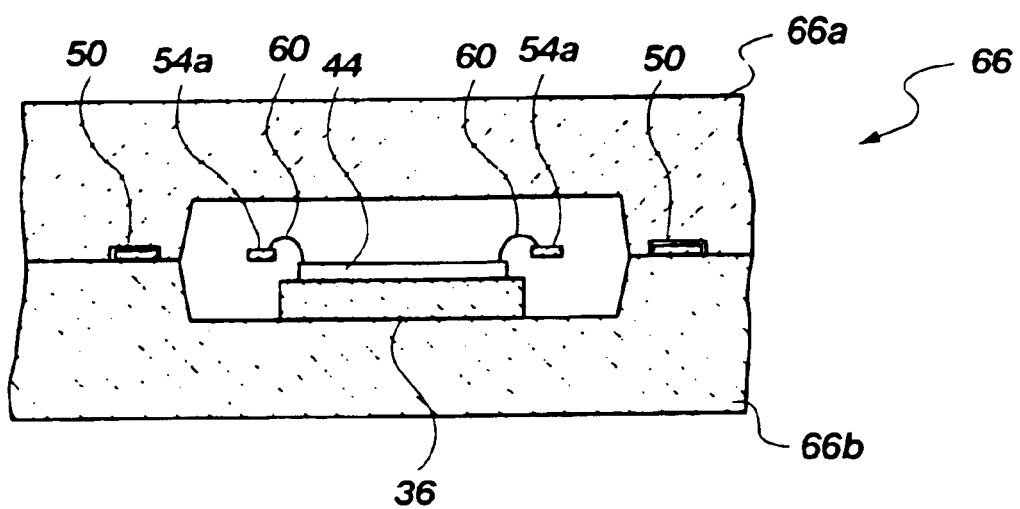
FIG. 9 is a cross-sectional view of a further semiconductor device according to the present invention.

FIG. 9 illustrates a further embodiment of the present invention in which die paddles of differing thicknesses are employed to assist in dissipation of heat via heat conduction. Usually, heat generated in operation of the semiconductor device is dissipated via heat conduction through leads to a circuit board and into portions of the molded package itself. Heat dissipation can be improved by diffusing the generated heat in a direction away from the semiconductor device and toward one or more external surfaces of the package. As previously discussed, one method of improving heat dissipation is through the selection of die paddle materials having an optimum quality for heat conduction. However, such limitations are avoided in the lead frame assembly of the present invention through the use of dissimilar materials in the manufacture of the first and second lead frames.

The embodiment illustrated in FIG. 9 also differs from the embodiment of FIG. 8 in that the inner lead portions 54*a* of the leads 54 do not overlap or extend over the active surface of the semiconductor device 44. It is understood that the inner lead portions 54a of the leads 54 can be of varying lengths, so as to permit any desired overlap of the die paddle 36, semiconductor device 44, or neither, i.e., no overlap of the active surface of the semiconductor device at all (as demonstrated in the present examples).

As previously stated, FIG. 9 illustrates another embodiment of the present invention in which a die paddle 36 is used as a heat sink, the die paddle 36 having a thickness sufficient that the bottom surface thereof contacts, if desired, a portion of the mold die forming the mold space. In operation, heat generated in a semiconductor device 44 is dissipated through the leads connected thereto, the thermosetting polymer forming the semiconductor die package, and the semiconductor die paddle.

The preferred heat sinks for use in the present invention comprise laminated metal sandwiches commonly referred to as copper-clad Invar and copper-clad molybdenum.

Figure 10:
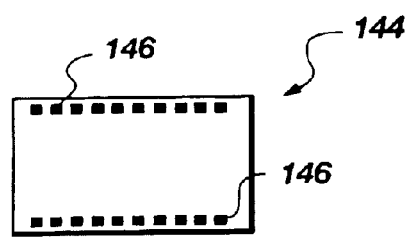
FIG. 10 is a plan view of another semiconductor device.

FIG. 10 illustrates a semiconductor device 144 having bond pads 146 placed in a linear arrangement on two opposing sides on the active surface of the semiconductor device 144. It is understood that any semiconductor device having various arrangements of bond pads known in the art can be used. It will also be understood that the semiconductor device 144 is not limited with respect to length, width, thickness, or material composition.

Figure 11:
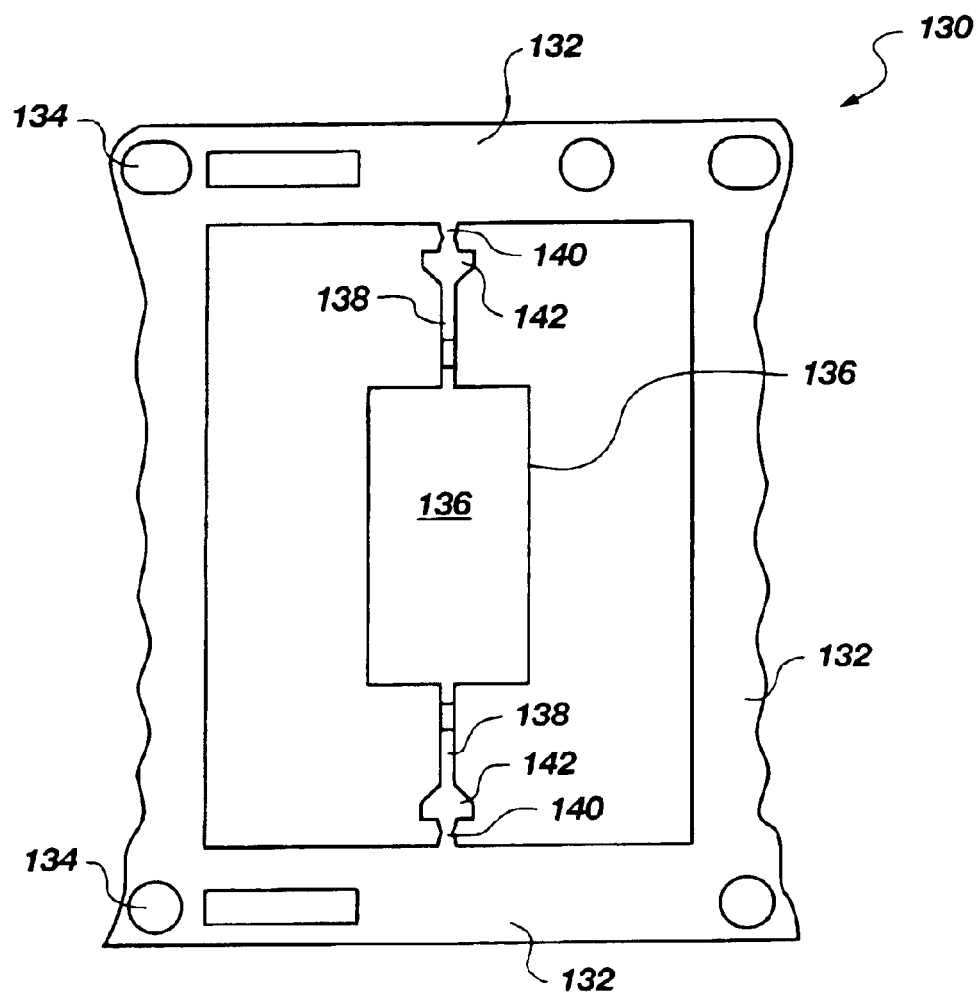
FIG. 11 is a plan view of a second embodiment of the first lead frame of the present invention.

Referring to FIG. 11, the first lead frame 130 of a second embodiment of the present invention comprises first carriers 132 running along the two longitudinal sides of the first lead frame and further is provided with alignment holes 134 thereon. A die paddle 136 is connected to first carriers 132 by means of tie bars 138. The die paddle 136 has sufficient length and width to easily accommodate semiconductor chips or dice of varying sizes and shapes. Tie bar cut zones 140 and attachment tabs 142 are provided on tie bars 138 for use in assembling the semiconductor device as described hereinbelow. Attachment tabs 142 consist of co-planar extensions emanating from the tie bars, each attachment tab 142 being substantially larger and/or wider than the tie bar 138 to which the attachment tab 142 is connected, although the attachment tab 142 may be any desired size and/or configuration suitable for use. Tie bar cut zones 140 consist of preweakened, cutaway or recessed portions located between the attachment tabs 142 and the first carriers 132 on the tie bars 138. As previously described hereinbefore, the tie bars 138 are bent downwardly, so as to position the die paddle 136 in a substantially horizontal arrangement with and at a lower level in relation to the first carriers 132 and first lead frame 130. Because the degree of pitch in the bend, as well as the length and width of the tie bars 138, are dependent on the height of the semiconductor chip or die to be placed on the die paddle 136, the tie bars 138 will correspondingly vary with regard to shape and angle of bend in order to accommodate a wide variety of semiconductor device shapes and sizes. Inclusion of first carriers 132 and alignment holes 134 permit the use of existing equipment used in single lead frame processes to accomplish the attachment of the semiconductor device 144 onto the die paddle 136.

Figure 12:
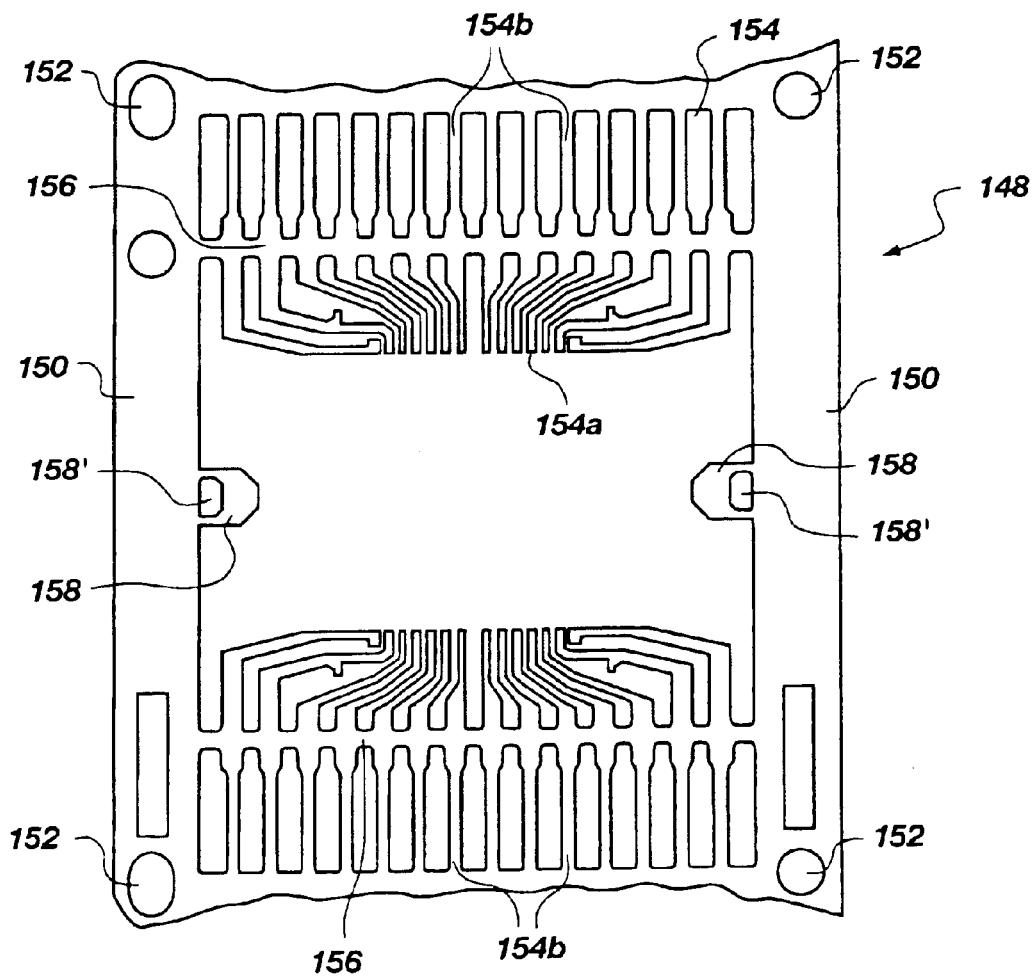
FIG. 12 is a plan view of a second embodiment of the second lead frame of the present invention.

FIG. 12 illustrates a second lead frame 148 according to a second embodiment of the present invention. The second lead frame 148 comprises second carriers 150 running along the two longitudinal sides of the second lead frame 148, alignment holes 152, a plurality of leads 154 consisting of an inner lead portion 154a, which does not overlap the die paddle or the active surface of a semiconductor device, and an outer lead portion 154b, dam bars 156 tying the leads 154 to each other and to second carriers 150, and attachment tab receiving portions 158 having apertures 158' therein. Each attachment tab receiving portion 158 is formed being of substantially the same size and shape as the attachment tab 142, or at least as large and substantially the same shape with which it is to be attached, although the attachment tab 142 and attachment tab receiving portion 158 to which it is attached may have any suitable desired size and shape, depending upon the geometry and size of the semiconductor device, the die paddle, and the lead frame. The second lead frame 148 can be made from any metallic material, non-metallic material, or any combinations thereof, which exhibit desirable properties with respect to, for example, electrical conductivity, coefficient of thermal expansion, strength, and formability which are compatible with, although preferably a different or separate material from, the first lead frame 130, but yet compatible therewith and with the semiconductor device 144. Well known examples of such materials (used alone or in combination) include, but are not limited to, alloy 42, copper, aluminum, and silver. Attachment tab receiving portions 158 having apertures 158' therein preferably consist of co-planar, flat extensions of the second carriers 150.

Alignment holes 134 and 152 can be formed in a variety of shapes and positions with the purpose of accommodating particular types of equipment used both to align and weld the first lead frame 130 to the second lead frame 148, as further described below. Alignment holes 134 and 152 preferably consist of uniformly shaped extruded sections of first and second carriers 132 and 150.

Figure 13:
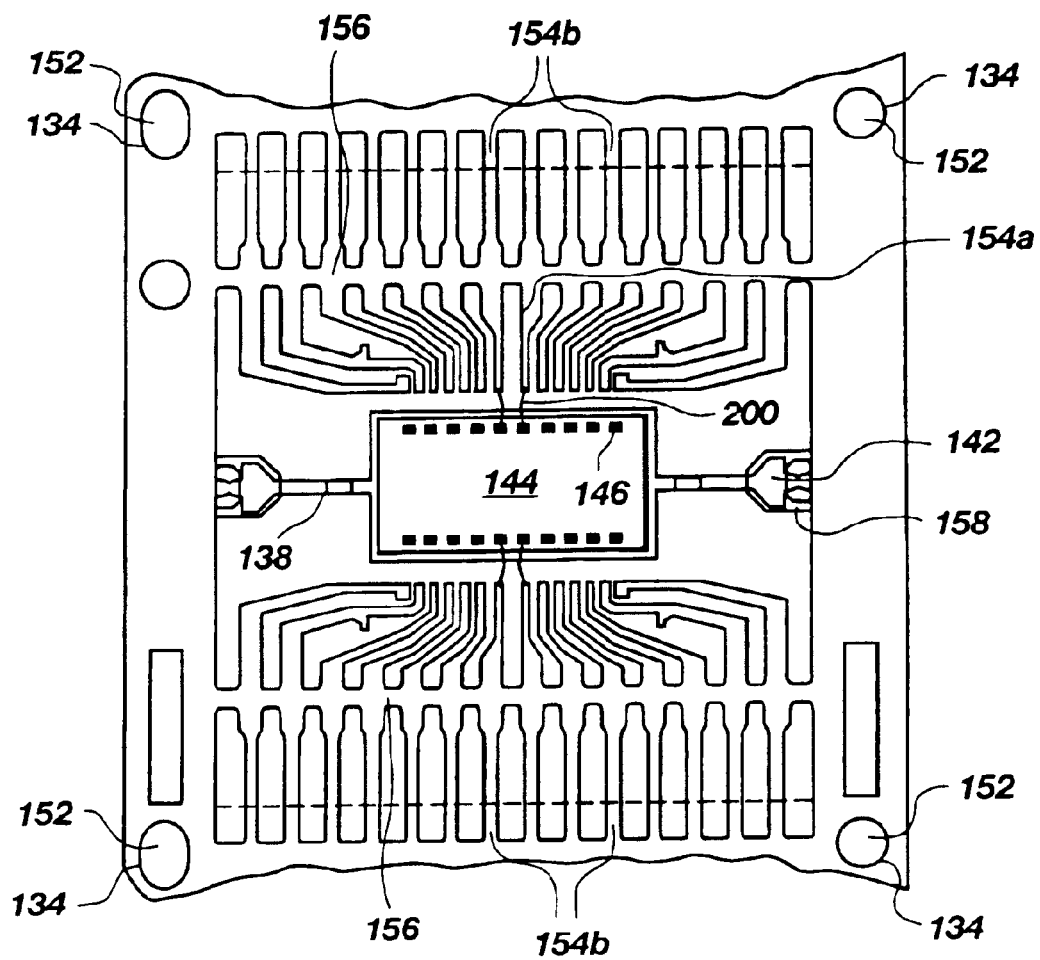
FIG. 13 is a plan view of the semiconductor device assembled with the first and second lead frames of the second embodiment of the present invention.

FIG. 13 illustrates the assembled first lead frame 130 and second lead frame 148 according to the second embodiment of the present invention. The semiconductor device 144 is attached or bonded onto the die paddle 136 of the first lead frame 130 using a conventional single lead frame process and equipment. As previously described, the first lead frame will comprise a die paddle 136 of sufficient size and sufficient depth (in relation to the first carriers 132) to accommodate a preselected semiconductor chip of a particular length, height, and width. The semiconductor device 144 can be bonded onto the die paddle 136 with, for example, silver paste, polyamide, or any other means of bonding known in the art. Once the semiconductor device 144 has been bonded to the die paddle 136, the first and second lead frames 130, 148 are aligned by superimposing a bottom surface of the second lead frame 148 onto a top surface of the first lead frame 130 and by aligning alignment holes 134 of lead frame 130 with the corresponding alignment holes 152 of the second lead frame 148. In the resulting alignment, the inner lead portions 154a of the second lead frame 148 extend adjacent two of the edges of the semiconductor device 144. The attachment tabs 142 of the first lead frame 130 are then attached or welded or bonded to the attachment tab receiving portions 158 of the second lead frame 148. It is understood that any suitable adhering or welding processes known in the art, such as spot welding, heat pressure welding, adhesive taping, polyamide bonding, etc. can be used. Once the alignment and adhering steps are completed, the first carriers 132 of the first lead frame 130 are removed from the die paddle 136, tie bars 138, and attachment tabs 142 by severing or cutting the tie bar cut zones 140 using any suitable severing or cutting tool which can extend through apertures 158' of attachment tab receiving portion 158 in the second lead frame 148. The first carriers 132 of the first lead frame 130 are discarded, leaving an intact second lead frame 148 including a die paddle 136 which is connected to the attachment tab receiving portion 158 of the second lead frame 148 by means of the tie bars 138 and attachment tabs 142. Thus, the present step in the method converts the double lead frame assembly of the prior "align and weld" step into a single lead frame assembly in order to facilitate the use of conventional single lead frame equipment in conducting the subsequent wire bonding step of the assembly process. Next, the inner lead portions 154a are subsequently connected by wires 200 to the appropriate bond pads 146 on the active surface of the semiconductor device 144. The wires 200 may be bonded to the inner portions 154a and bond pads 146 by any suitable means, such as wire bonding.

It will be understood that changes, additions, deletions, and modifications as described hereinbefore may be made to the present invention which fall within the scope thereof.

What is claimed is:

1. An assembly method for a semiconductor device assembly having a semiconductor die therein, said semiconductor die having an active surface having a plurality of bond pads thereon, said assembly method comprising:

providing a first lead frame of a first material having a first set of desirable material properties, said first lead frame including a die paddle of said first material;

attaching said semiconductor die to said die paddle;

providing a second lead frame of a second material having a second set of desirable material properties different than those of the first material, said second lead frame including at least two carriers and a plurality leads, each lead having an inner lead portion;

securing a portion of said die paddle to a portion of said second lead frame; and connecting said inner lead portion of each lead and at least one bond pad of said plurality of bond pads of said semiconductor die.

2. The method of claim 1, wherein securing comprises welding.

3. The method of claim 1, wherein securing comprises adhesive bonding.

4. The method of claim 1, further comprising:

applying an insulating film to a portion of said active surface of said semiconductor die.

5. The method of claim 1, further comprising:

applying an insulating film between a portion of said active surface of said semiconductor die and said inner lead portion of at least one lead of said plurality of leads.

6. The method of claim 1, further comprising:

molding said semiconductor die and portions of said plurality of leads in a plastic body.

7. An assembly method for a semiconductor device assembly having a semiconductor die therein, said semiconductor die having an active surface having a plurality of bond pads thereon, said method comprising:

providing a first lead frame including a die paddle, first carriers, each of said first carriers having at least one first alignment hole therein, at least one tie bar, and at least one attachment tab extending from said at least one tie bar, said at least one tie bar interconnecting said die paddle and a carrier of said first carriers;

attaching said semiconductor die to at least a portion of said die paddle;

providing a second lead frame including second carriers, each of said second carriers having an attachment tab receiving portion affixed thereto and at least one second alignment hole therein, and a plurality of leads, at least one lead of said plurality of leads having an inner lead portion and an outer lead portion;

aligning said at least one first alignment hole of a carrier of said first carriers of said first lead frame and said at least one second alignment hole of a carrier of said second carriers of said second lead frame;

joining portions of said at least one attachment tab of said first lead frame to portions of said attachment tab receiving portions of said second carriers of said second lead frame;

severing said at least one tie bar at a point between said at least one attachment tab and said first carriers; and connecting said inner lead portion of said at least one lead and at least one bond pad of said plurality of bond pads of said semiconductor die.

8. The method of claim 7, wherein joining comprises welding said at least one attachment tab of said first lead frame to said attachment tab receiving portions of said second carriers of said second lead frame.

9. The method of claim 7, wherein joining comprises adhesively bonding said at least one attachment tab of said first lead frame and said attachment tab receiving portions of said second carriers of said second lead frame.

10. The method of claim 7, wherein said first lead frame further includes tie bar cut zones located between said at least one attachment tab and said first carriers, and wherein severing said at least one tie bar comprises cutting said tie bar cut zones.

11. The method of claim 7, further comprising:

applying an insulating film to a portion of said active surface of said semiconductor die.

12. The method of claim 7, further comprising:

applying an insulating film between a portion of said active surface of said semiconductor die and said inner lead portion of said at least one lead of said plurality of leads having said inner lead portion and said outer lead portion.

13. The method of claim 7, further comprising: enclosing said semiconductor die in a plastic body.

* * * * *

UNITED STATES PATENT AND TRADEMARK OFFICE
CERTIFICATE OF CORRECTION

PATENT NO. : 6,902,952 B2
APPLICATION NO. : 10/076849
DATED : June 7, 2005
INVENTOR(S) : S. Derek Hinkle, Jerry M. Brooks and David J. Corisis It is certified that error appears in the above-identified patent and that said Letters Patent is hereby corrected as shown below:

COLUMN 6, LINE 24,   change "alloy 42," to --alloy 42,--
COLUMN 7, LINE 23,   change "alloy 42," to --alloy 42,--
COLUMN 10, LINE 21,  change "alloy 42," to --alloy 42,--

Signed and Sealed this

Sixth Day of November, 2007

JON W. DUDAS
*Director of the United States Patent and Trademark Office*